(12) United States Patent
Bruwer

(10) Patent No.: US 9,948,297 B2
(45) Date of Patent: Apr. 17, 2018

(54) PRESSURE DEPENDENT CAPACITIVE SENSING CIRCUIT SWITCH CONSTRUCTION

(76) Inventor: Frederick Johannes Bruwer, Paarl (ZA)

( * ) Notice: Subject to any disclaimer, the term of this patent is extended or adjusted under 35 U.S.C. 154(b) by 541 days.

(21) Appl. No.: 13/641,124

(22) PCT Filed: Apr. 8, 2011

(86) PCT No.: PCT/ZA2011/000021
§ 371 (c)(1),
(2), (4) Date: Dec. 26, 2012

(87) PCT Pub. No.: WO2011/130755
PCT Pub. Date: Oct. 20, 2011

(65) Prior Publication Data
US 2013/0093500 A1    Apr. 18, 2013

(30) Foreign Application Priority Data

Apr. 14, 2010  (ZA) .................................. 2010/02622
Aug. 23, 2010  (ZA) .................................. 2010/06011

(51) Int. Cl.
| | |
|---|---|
| *H03K 17/96* | (2006.01) |
| *H03K 17/955* | (2006.01) |
| *G06F 3/044* | (2006.01) |
| *H03K 17/975* | (2006.01) |

(52) U.S. Cl.
CPC ......... *H03K 17/9622* (2013.01); *G06F 3/044* (2013.01); *H03K 17/955* (2013.01); *H03K 17/962* (2013.01); *H03K 17/975* (2013.01); *G06F 2203/04105* (2013.01); *H03K 2217/94036* (2013.01); *H03K 2217/960755* (2013.01)

(58) Field of Classification Search
CPC ......... G06F 2203/04105; G06F 3/0488; G06F 3/044; H03K 17/962
USPC .......................................... 345/173; 327/517
See application file for complete search history.

(56) References Cited

U.S. PATENT DOCUMENTS

| | | |
|---|---|---|
| 5,917,165 A | 6/1999 | Platt et al. |
| 5,917,906 A | 6/1999 | Thornton |
| 6,115,030 A | 9/2000 | Berstis et al. |
| 6,204,839 B1 | 3/2001 | Mato |
| 6,288,707 B1 | 9/2001 | Philipp |
| 6,373,265 B1 | 4/2002 | Morimoto et al. |
| 6,429,846 B2 * | 8/2002 | Rosenberg et al. ........... 345/156 |
| 6,430,023 B1 | 8/2002 | Suzuki |
| 6,587,097 B1 * | 7/2003 | Aufderheide ........... G06F 3/045 345/104 |
| 6,621,029 B2 | 9/2003 | Galmiche et al. |

(Continued)

FOREIGN PATENT DOCUMENTS

EP          2026178 A1 *  2/2009

*Primary Examiner* — Michael Faragalla
*Assistant Examiner* — Chayce Bibbee
(74) *Attorney, Agent, or Firm* — William A. Blake LLC

(57) ABSTRACT

A user interface which includes a capacitive measurement circuit with a sense plate covered by an electrically conductive cover member, and wherein said circuit may sense two types of events, said types distinguished by an inverse change in measured capacitance, and wherein user proximity and touches with less than a minimum required force constitute one event type, and touches with more than said minimum force constitute the other event type.

20 Claims, 6 Drawing Sheets

(56) References Cited

U.S. PATENT DOCUMENTS

| | | |
|---|---|---|
| 6,646,631 B2 | 11/2003 | Suzuki et al. |
| 6,704,005 B2 | 3/2004 | Kato et al. |
| 6,823,747 B2 | 11/2004 | Hasegawa et al. |
| 6,867,601 B2 * | 3/2005 | Morimoto .................... 324/661 |
| 6,894,507 B2 | 5/2005 | Morimoto |
| 6,933,732 B2 | 8/2005 | Morimoto |
| 7,091,886 B2 | 8/2006 | DePue et al. |
| 7,151,528 B2 | 12/2006 | Taylor et al. |
| 7,279,647 B2 | 10/2007 | Philipp |
| 7,372,281 B2 | 5/2008 | Morimoto |
| 7,429,976 B2 | 9/2008 | Harley et al. |
| 7,444,163 B2 | 10/2008 | Ban et al. |
| 7,639,234 B2 | 12/2009 | Orsley |
| 7,667,947 B2 | 2/2010 | Schilling et al. |
| 7,710,126 B2 | 5/2010 | Morimoto |
| 7,721,609 B2 | 5/2010 | Wright |
| 7,808,487 B2 | 10/2010 | Taylor et al. |
| 7,813,774 B2 | 10/2010 | Perez-Noguera |
| 7,889,176 B2 | 2/2011 | Harley et al. |
| 7,935,904 B2 | 5/2011 | Song |
| 7,978,175 B2 | 7/2011 | Orsley |
| 8,059,015 B2 | 11/2011 | Hua et al. |
| 8,076,949 B1 | 12/2011 | Best et al. |
| 8,390,481 B2 | 3/2013 | Pance et al. |
| 8,395,395 B2 | 3/2013 | Bruwer et al. |
| 2002/0025837 A1 | 2/2002 | Levy |
| 2002/0049070 A1 | 4/2002 | Bick |
| 2004/0077373 A1 | 4/2004 | Choi et al. |
| 2006/0161870 A1 | 7/2006 | Hotelling et al. |
| 2006/0176270 A1 | 8/2006 | Sachs |
| 2006/0192754 A1 | 8/2006 | Sachs et al. |
| 2006/0232557 A1 | 10/2006 | Fallot-Burghardt |
| 2006/0244733 A1 * | 11/2006 | Geaghan ....................... 345/173 |
| 2007/0151838 A1 | 7/2007 | Lundell et al. |
| 2008/0204126 A1 * | 8/2008 | Wang et al. .................. 327/551 |
| 2008/0283310 A1 | 11/2008 | Moore |
| 2009/0057124 A1 | 3/2009 | Orsley et al. |
| 2010/0103116 A1 | 4/2010 | Leung et al. |
| 2010/0253629 A1 | 10/2010 | Orsley |
| 2010/0253651 A1 | 10/2010 | Day |
| 2011/0038114 A1 | 2/2011 | Pance et al. |
| 2011/0043227 A1 | 2/2011 | Pance et al. |
| 2011/0163982 A1 | 7/2011 | Wadia |

\* cited by examiner

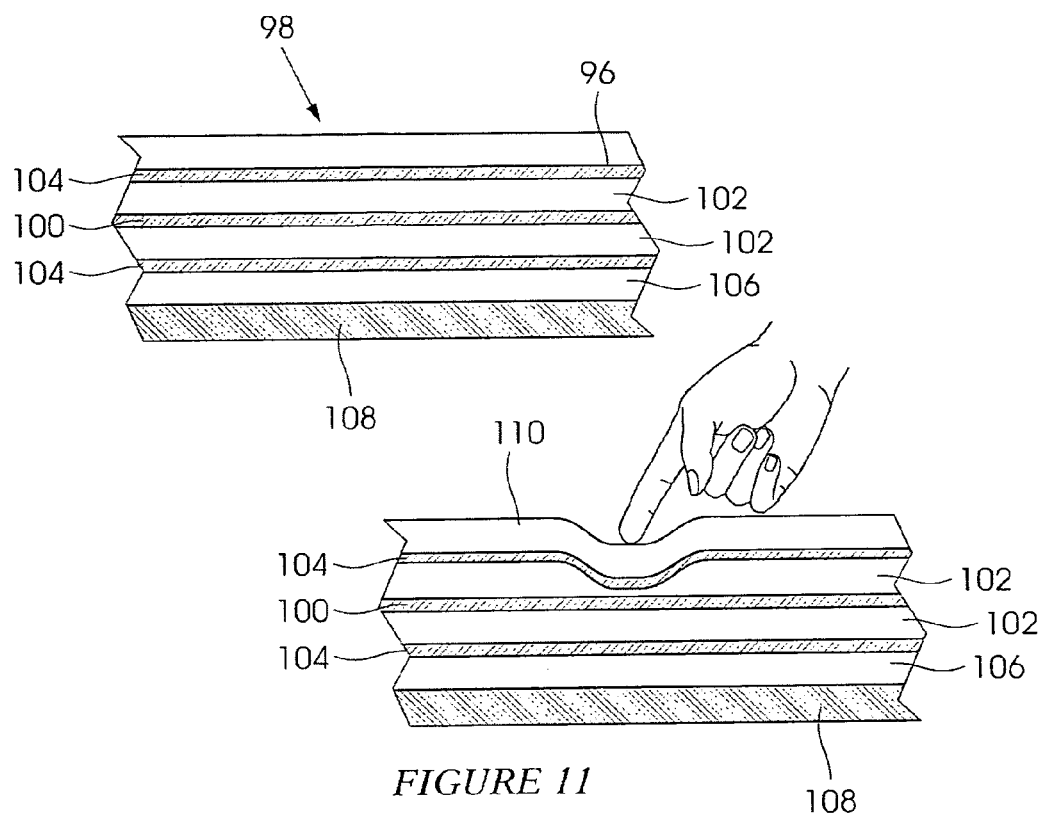
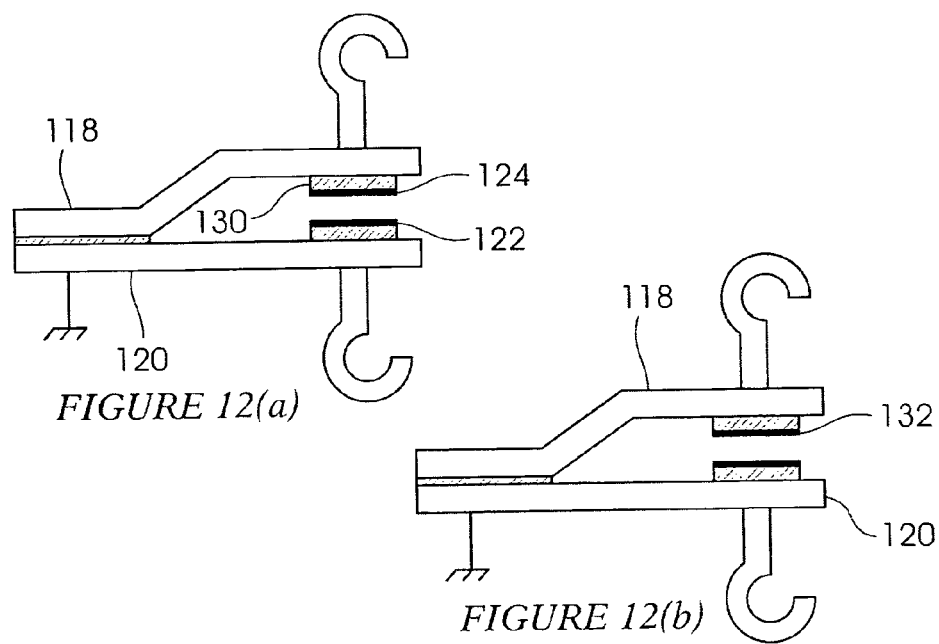

PRESSURE DEPENDENT CAPACITIVE SENSING CIRCUIT SWITCH CONSTRUCTION

BACKGROUND OF THE INVENTION

This invention relates generally to the construction of pressure-dependent capacitive sensing switches.

Capacitive sensing technology has become popular for use in touch switches covering contact, non-contact and two-dimensional user interface implementations.

As in most technologies, capacitive sensing technologies have strong points like cost, easy form factor integration, and selectable or adjustable force (contact) operation. These technologies also work with various overlay materials. The technology has become popular for user interface implementation, arguably since the year 2000. Various different implementations are used (see products from Cypress, Atmel, Microchip and Azoteq) and capacitive sensors feature in several trend-setting products (e.g. the iPod® and the iPhone® from Apple).

At present however capacitive sensing is seen as lacking certain features that are promoted as being the strength areas of inductive sensing technologies.

Specifically, inductive sensing is promoted as being superior in its robustness against RF noise and general noise, and as a much better technology with regard to immunity against accidental activation (see Microchip Inductive Sensing Products). A product like the iPhone® from Apple is sophisticated enough to combat accidental activation in a user's pocket through the requirement that a slide action must be performed quite accurately to activate the product. This type of complexity is not always possible, particularly if a user interface only comprises buttons, or if an unlocking sequence would not be acceptable.

Another problem is the presence of water or other fluids and objects coming into contact with the capacitive sensing structure. This may lead to accidental proximity or touch detections.

Inductive sensing is promoted as a good solution against accidental activation as it essentially depends on a physical deflection between a surface (electrically conductive or with magnetic permeability) and an excitable coil. Since the surface is electrically conductive it can act as a shield which helps to deliver very robust performance in noisy environments.

It is an object of this invention to provide a capacitive sensing technology implementation to overcome a number of the perceived shortcomings of capacitive sensing as stated in the art, as discussed above. It is also shown that this capacitive sensing implementation matches inductive sensing on a number of its perceived strong points. As capacitive sensing comprises a simple technology, implementable at low cost, with low power consumption and offers reliable operation, this holds definite market value.

SUMMARY OF INVENTION

In its simplest form the sensor in this invention (based on capacitive sensing technology) can be viewed as a capacitive sensing plate (pad or antenna) closely covered by, but not making contact with, a metal or electrically conductive surface. When contact measurements are made this electrically conductive surface is connected to the system ground. This is directly against the normal practice of designing with capacitive sensing technology, as almost all of the capacitive flood lines will flow to the grounded surface. If the grounded conductive surface is big enough to substantially or extensively cover the sense plate, no capacitive sensing is possible from the sense plate beyond the grounded surface.

However, this is an advantage in terms of shielding the capacitive sensor from noise (RF or other), water and other fluids, moisture or any capacitive objects in touch or in close proximity with the grounded surface covering the sense plate. The objects will have no influence on the capacitive measurements of the sense plate due to the shielding provided by the grounded surface.

However, with a grounded surface so close to and fully covering the sense plate, the capacitive value between the sense plate and ground is very high. In normal practice this would yield very low counts in a charge transfer implementation and would be very sensitive to manufacturing tolerances. Such low counts would diminish sensitivity and this may be a reason why this surprisingly effective technique has not been recognised and successfully exploited before.

The electrically conductive surface or layer may be implemented in a variety of ways:
(1) the layer may be wholly metal such as a sheet of metal e.g. aluminium, copper, stainless steel;
(2) the layer may be formed by fixing a thin metal foil onto a more rigid but still flexible non-conducting material e.g. tinfoil or copper tape stuck or glued onto a plastic or nylon sheet;
(3) the layer may be formed using an electrically conductive ink, glue, paint or other fluid to cover a flexible sheet (or other shape) of a non-conducting material;
(4) the conductive layer may be formed on glass or other transparent material, using for example, ITO (indium tin oxide); and
(5) the layer may be formed as a pre-constructed, flexible, multi-layered film that can be manufactured or cut to specific size or form factor dimensions.

By using the ProxSense™ capacitive sensing technology offered in some products, e.g. by Azoteq (Pty) Ltd (see IQS127), to automatically compensate for large capacitive sense plates to enhance the sensitivity, the structure of a grounded surface covering (not making contact with) a sense plate can have a surprisingly positive result in terms of using the capacitive sensor to construct a switch influenced only by mechanical movement that is effected by physical pressure exerted during contact. A way to influence the capacitive measurement on the sense plate constructed in accordance with this invention is to vary the distance between the grounded surface and the sense plate (pad or antenna), since all capacitive measurements terminate at the grounded surface.

This is equivalent to the operation and requirements of inductive sensing technologies in which the detection of switch operation is dependent on the physical deflection, under force, of a covering surface.

This functionality is readily described in terms of two plates forming a plate capacitor, see the following equations:

$$C = \frac{Q}{V}$$

C=farads (meaning 1 farad=1 coulomb per volt).
For a parallel plate capacitor the capacitance can be calculated by:

$$C = Er\, Eo \frac{A}{d}$$

Er=relative static permittivity (or dielectric constant) of the material between the plates;
Eo=electric constant≈8.854×10$^{-R}$ fm$^{-1}$;
d=distance between the plates in meters;
A=plate area in square meters; and
C=capacitance in farads.

If the distance between the two plates is x mm, then a deflection (narrowing of the spacing between the plates) of 10% will typically have a $$\frac{100}{90}$$

effect on the capacitance between the plates. Of course this applies only to the area that is deflected.

The sensor design thus becomes a matter of the relation between the defection achievable, the distance between the sense plates, the stability of the plates, the surface area of the plates and the resolution of the capacitive sensor.

Although the above has been described with surface (self) capacitive measurement technology as a basis, the same principles apply to a projected or mutual capacitive measurement method with a grounded surface covering the two sense plates. Of course, in the case of projected or mutual capacitive measurement the deflection bringing the grounded surface closer to the sense plate will result in more capacitance flood lines being "stolen or absorbed" into ground and hence the capacitance will be lower. This is opposite to self- or surface-capacitance measurements.

On the other hand projected measurements offer further implementation options. For example, a conductive surface covering the two antenna plates (Crx—receiver, Ctx—driver), may be grounded as described above. Or the conductive cover member may be floating (i.e. not connected to earth and not grounded) and a) covering a number of projected measurement antenna pairs or b) covering only individual antenna pairs (i.e. no conductive link between the conductive covering members of individual pairs.) The conductive cover surface or member may be floating only during certain periods such as only during a defined certain period of some measurement.

In a) above an object that couples capacitively between the conductive surface and ground will have a similar effect on all the measurement pairs. However, if physical pressure is exerted and a deflection occurs above a specific pair of projected measurement antennas, then this pair will measure a different result than the rest. Furthermore a deflection that will result in contact between the covering conductive layer (electrical or just removing any air gap) and the antenna pair will have another effect on the measurements made at this antenna pair in that the capacitive coupling between the driver and receiver antennas may be significantly enlarged. As such three levels of user interaction with the switch can be identified—proximity, touch (small or no deflection) and a hard press (resulting in contact with the antennas) can all be sensed and identified by using the results of the projected capacitive measurements.

The situation with regards to b) above is similar but more localised for individual pairs. As such a proximate object or an object touching (but no deflection) and coupling capacitively with the conductive surface above a specific antenna pair will have a much more pronounced effect on the measurement of that specific pair than what is found in a) above.

According to these structures it is possible to make a keyboard consisting of a matrix of driver and receiver structures of a projected capacitive measurement system that will allow for the recognition of proximity of an object (e.g. a user finger) above a key of a keyboard, or an object touching a key of a keyboard and by linking sequential measurements of such object moving over the keyboard, a tracking mechanism similar to a mouse or a trackpad can be implemented.

Of course the information extracted from the measurement data can also identify specific keys and proximity, touch or pressure strength of an object in association with the specific key. It is specifically advantageous that the normal keyboard lines can be used to duplicate the normal keyboard functions and provide the additional information. It is also within the scope of this invention to provide key/button/switch structures without requiring electrical contact to be made. It may be required to still use a snap dome or similar mechanism to provide a tactile effect but no electrical contact is required. This has many advantages in terms of safety, manufacturability, durability, reliability and materials suited for implementation. Similar constructions are possible for surface capacitive measurement systems.

Two important factors are clear. Firstly, the distance between the plates must be in relation to the deflection. For example if a deflection of one micron is the norm to be achieved then a gap of one centimeter between the sense plate and the grounded surface is unlikely to give a satisfactory result due to the high resolution that would be required to accurately detect the deflection. But if a 10 micron deflection is possible, then a one millimeter space between the plates seems very practical due to the 1 in 100 resolution required to detect the deflection.

Secondly, for practical low cost systems, the manufacturing of very tight mechanical tolerances is problematic. Hence it is imperative that automatic adjustment of the capacitive sensor is possible to compensate for mechanical tolerance in manufacturing as well as the effects of temperature drift, component variation and other variables in the construction of the sensor.

By making use of Azoteq's parasitic capacitance cancellation techniques (as referred to hereinbefore) the "distance" between the plates can be "adjusted" to allow operation with smaller deflections. For example if a practical situation allows for the grounded cover plate to be not closer (say) than 1 mm to the sense plate and a 10% change in capacitance is required for detection of a touch, then this means the deflection on the surface must be at least 0.1 mm. If due to material constraints etc. the optimal deflection is, say, only 0.05 mm, this can be achieved by removing through parasitic capacitance cancellation techniques half of the capacitance formed in the plate capacitor formed between the sense plate and the cover plate. The 0.05 mm deflection will then result in the desired percentage change in capacitance.

It is also possible to use the technique in measurement of change in distance when the plates are in fact pulled apart (i.e. away from each other). Now the capacitance measured (surface or self-capacitance method) will decrease with distance and the counts in a charge transfer system will increase, whereas in a mutual or projected method of measurement the counts would decrease.

These are also valuable techniques for implementing products such as, for example, scales to measure weight such as by pulling plates apart for hanging scales and pressing plates together for scales upon which objects are placed, for example bathroom or kitchen scales. Products such as these normally use strain gauges for mass measurement, but now functions such as wake-up technology for backlighting etc; proximity detection; button technology (e.g. settings and mode selections); physical contact touch sensor technology and mass measurement; physical contact with pressure and grounded surface technology; can all be implemented by a single capacitive measurement device or microchip.

The material between the plates must preferably be of a compressible nature and form a di-electric. The material can be air or another type of material that forms an automatic spacer structure and ideally prevents electrical contact between the plate and the grounded surface. Preferably the material must be immune to moisture absorption that would affect the capacitance between the sense plate and the grounded surface.

It may be important for the sense plate to be shielded by a grounded layer from all angles where activity may take place. If the sense plate is part of a handheld device such as a mobile phone or a remote control unit, then an object at a lower side of the device could influence the sense plate as easily as an object at an upper side of the device.

This technique also finds application (e.g. as user interface switches) in diverse products such as remote keyless entry transmitters (low cost, ease of manufacturing, housing/button advantages, reliability), kitchen appliances (an immunity to the effects of fluids, prevention of accidental activation), industrial products, electric toothbrushes and other personal care products.

The implementation of a pressure only switch can have significant cost advantages during production of a product housing. Instead of the normal rubber-type button insert, the housing can be moulded with a knob structure and with a construction that will allow for slight deflection under pressure. This will reduce the component count and simplify construction. Waterproofing, moulding construction and sealing of the housing will be easier.

The use of this type of capacitive sensing technology makes the construction of user interface switches simple and enables easy cleaning through washing or low pressure wiping without risk of accidental button or switch activation.

In a further embodiment the grounded surface covering the sense plate, at times of inactivity, is insulated from ground and is then used as a sense plate (surface/self-capacitance sensing or mutual/projected measurements) to sense proximity of a user. When a proximity event is detected, then a visible (or haptic) indicator may be activated. The layer is then again grounded and then checked to determine if a deflection is occurring that would indicate a user action to operate a switch through applying physical pressure or force to the surface.

In essence the same capacitive sensing device and structure may be used for a wake-up feature (proximity detection), user guidance and also for a touch activation that requires a certain minimum amount of pressure for activation, in order to prevent accidental activation.

The same capacitive sensor device may also implement a capacitive sensing touch switch (contact or proximity) that is dependent on mechanical pressure in the sense that it measures a deviation of capacitance at the sense plate without requiring any physical deflections. Traditional touch sensor sliders, scroll wheels, or individual buttons etc. can be constructed.

As per the description above, a single capacitive sensor can be used to construct a user interface comprising a pressure-only switch (e.g. critical switch on/off or mode selection) that is very robust against noise and accidental operation with proximity functionality (e.g. wake-up, back lighting, product status indication, product selling information), as well as a capacitive sensing switch based on non-deflection (no pressure but physical contact) contact operations (e.g. a button, matrix of buttons, a slider, a scroll wheel, a touch device, etc.). Three separate detections may be indicated to a product controller from the user interface switching unit viz proximity detection, and physical contact detection, physical product with pressure detection (Cappo—Capacitive pressure only).

The implementation may comprise a uniformly conductive/resistive two dimensional layer or surface position in opposing capacitive sensing pads or antennae. When the layer is grounded, it will require physical pressure to effect a deflection in order to change the capacitance between the sense pad and the grounded layer. However, if the uniformly conductive/resistive layer or surface is connected to capacitive measurement sensors, then it can operate as a traditional (non-deflection) touch sensor.

In another embodiment the grounded conductive layer is positioned over a two-dimensional touch sense plate. The two-dimensional sense plate may be implemented using projected or surface measurement techniques to allow single or multiple touch position measurements. The point(s) of physical contact cause a deflection in the grounded conductive layer and at that point the capacitance between the grounded layer and the two dimensional sense plate is changed. This change is detected and is used as in normal 2D (two-dimensional) capacitive sense plates to determine the position of contact.

The technology can also be used for underwater switches. Operation of the sensor, through the medium of gloves worn by a user, or by the movement of a non-conductive rod, is possible. The implementation of a compressible sense pad construction is also addressed in U.S. Pat. No. 7,528,508 B2 to Bruwer the content of which is hereby incorporated into this specification in its entirety.

Although a number of applications and products have been used in the preceding description, these are exemplary only, and must not be seen as limiting the scope of this invention.

As a further example of application consider a portable device such as a mobile phone, an MP3 (MPx) audio product or a remote control device with a 2D touch screen. This type of touch screen is often covered with an ITO (or an electrically conductive layer).

It is common for such products to have a separate on/off switch that requires mechanical pressure to operate. This is normally a measure to protect against accidental operation.

According to this invention the separate electromechanical switch is removed and a pressure sensitive only switch based on capacitive sensing is implemented using glass with a conductive (ITO) coating as a grounded layer. Again the capacitive sensing may also sense proximity and, upon detecting a proximity event, may activate a visible indicator to show the position of such a switch.

In another embodiment of this invention the formation of a matrix of keys using projected (common in the art) and surface (not common in the art) capacitance may be implemented for operation under a grounded conductive layer. This provides significant advantages with regard to pin-count in larger keypads (i.e. more keys).

It is also advantageous to create a specifically constructed "overlay". This may be (a) of a flexible type that can be stuck on a curved hard surface that holds the sense pads, or (b) with an inflexible bottom layer in either a flat or pre-curved format.

Thus, according to one aspect of the invention there is provided an electronic measurement circuit attached to at least one sense plate wherein the sense plate is substantially covered by an electrically conductive layer that is connected to ground during specific measurements, and wherein the sense plate is insulated from this grounded electrically conductive material.

Preferably, the grounded electrically conductive layer deforms under pressure in a way that results in a deflection near the sense plate, resulting in a change in capacitance measured on the sense plate.

The circuit may be implemented to perform a surface capacitive measurement, or to perform a projected capacitive measurement.

In one form of the invention the electrically conductive layer is not connected to ground during some measurements and the measurements which are then made are substantially independent of a physical deflection.

Preferably in specific embodiments the electrically conductive layer is not grounded during some measurements to enable the detection of proximity (non-touch) events by measuring and detecting changes in the measurements of the sense plate.

The electrically conductive layer may be connected to a further measurement circuit during the non-grounded measurements.

The electronic measurement circuit may include a plurality of the sense plates which are configured to operate as a matrix and wherein a deflection of the grounded electrically conductive layer affects at least two sense plates to cause the recognition of a matrix key activation.

The invention also provides a combination of the electronic measurement circuit and an electrically conductive layer which is connected to the system ground and which substantially encapsulates the electronic measurement circuit and the sense plate, and wherein a deflection of the electrically conductive layer causes a variation in the measured capacitance of the sense plate.

The invention also provides a method of using a capacitive measurement circuit that is connected to a sense plate, the sense plate being insulated from, and covered by, an electrically conductive layer, wherein the method includes the step of connecting the electrically conductive layer to ground during a measurement of the sense plate and wherein a physical deflection of the grounded electrically conductive layer under physical pressure results in a change in the capacitive measurement of the sense plate.

The method may also include the step of disconnecting the electrically conductive layer from ground during a measurement of the sense plate, and wherein a change in measurement results that is not dependent on a physical deflection of the electrically conductive layer.

The capacitive measurement circuit may be connected to a plurality of the sense plates and the method may include the step of configuring the sense plates in a matrix structure.

In one form of the invention the capacitive measurement circuit includes a plurality of the sense plates and the method includes the steps of using a pre-constructed multilayer membrane to provide the electrically conductive layer, and attaching a compressible material to the electrically conductive layer thereby to space the electrically conductive layer from a third rigid layer that is attached to the sense plates or which is positioned adjacent the sense plates.

BRIEF DESCRIPTION OF THE DRAWINGS

The invention is further described by way of examples with reference to the accompanying drawings in which:

FIG. 11 shows a grounded layer positioned over a 2D sense plate to create a CAPPO-type 2D interface; and FIGS. 12(a) and 12(b) show projected and self-capacitive measurement techniques applied to measurement of distance for example an electronic scale.

DESCRIPTION OF PREFERRED EMBODIMENT

The invention discussed herein is principally directed at the use of capacitive sensing technology to implement a switch or user interface selection structure to rely almost exclusively on pressure or force to effect operation in a specific mode.

This is in direct contrast to normal practice where capacitive sensing switches are inherently immune to force (unless the force causes better capacitive coupling) and as such a person with gloves often finds it troublesome to operate a capacitive touch sensing switch.

Figure 1:
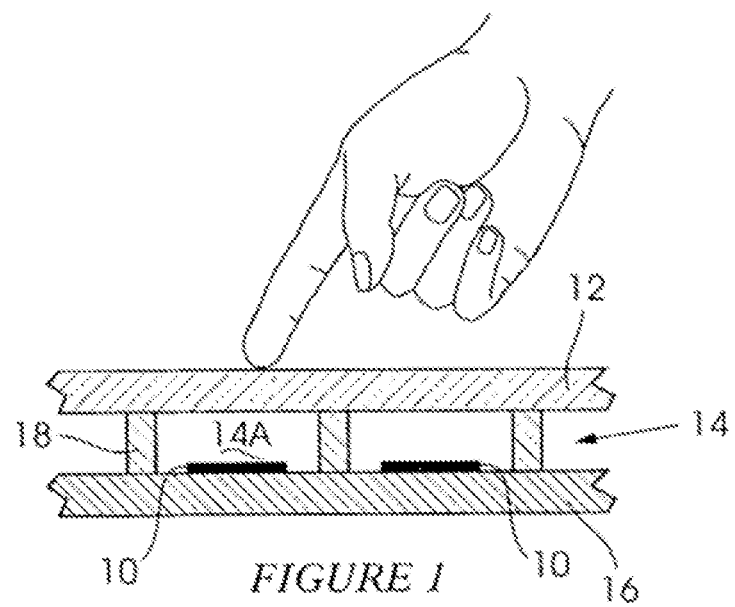
FIGS. 1 and 2 respectively show capacitive sensing pressure only switches according to the invention.
Figure 2:
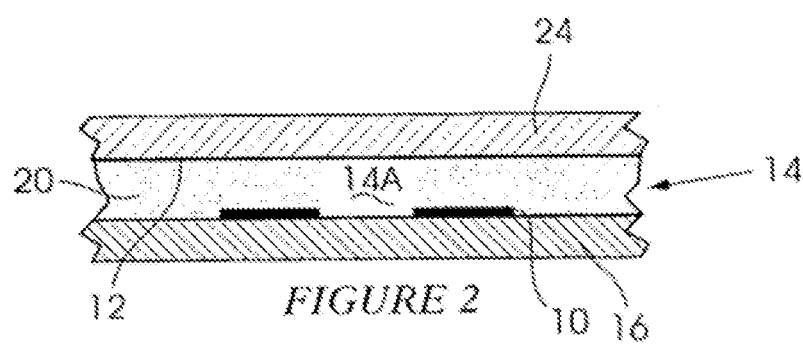

The construction of such a capacitive sensing, pressure only switch is shown in FIG. 1. A different type of such switch sensor is shown in FIG. 2.

Normally the designer of a capacitance sensing circuit is advised to keep grounded tracks and surfaces away from the sense plate in order to prevent large capacitance forming to ground and hence resulting in a loss of sensitivity.

However, due to Azoteq's parasitic capacitance cancellation technology, the capacitance between the sense plate and ground can be largely cancelled or negated. In FIGS. 1 and 2 capacitive plates or sensor pads 10 (antennae) are placed in close proximity below an electrically conductive layer 12. A space 14 between the sense pad and the conductive layer forms a dielectric 14A and creates a structure similar to that of a parallel plate capacitor.

When the distance a between the plates (sense plate and conductive member/metallic layer) of the capacitor decreases, the capacitance increases in an inversely proportional manner to the distance between the plates.

In its simplest form the conductive layer is grounded to the system ground. The sense plates are, for example, formed as a copper pour on a printed circuit board 16 connected to a capacitive measurement circuit (not shown). The plates may be kept apart by a pillar structure 18 (FIG. 1) or a foam-type material 20 (FIG. 2) that forms a dielectric 14A.

The printed circuit board or bottom layer 16 should typically be more rigid than a flexible upper layer or overlay 24. The top layer's physical characteristics determine the pressure required to effect a suitable deflection (that results in an activation detection). The magnitude of the deflection in turn determines the change in capacitance that must be sensed by the measurement circuit in order to detect the deflection, i.e. the user action to operate the switch.

Figure 4:
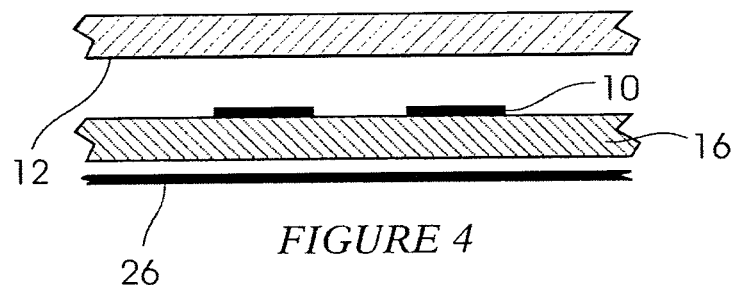
FIG. 4 shows the switch of FIG. 2, with an active driven shield, to provide a shield at user interface.

The sense plate 10 can be fully covered and surrounded by a grounded conductive layer 12 (FIG. 2) or by a grounded conductive layer 12 and an active driven shield surface 26—see FIG. 4. As such, the capacitive measurement circuit sensor clearly cannot detect anything beyond the conductive layer or layers. Therefore the device is exclusively dependent on movement between the conductive layer and the sense plate 10 to vary the capacitance measured at the sense plate.

FIG. 2(*a*) shows two sense plates $C_{x0}$ and $C_{x1}$ respectively. Even though both sense plates may detect a change in capacitance due to the deflection of the grounded conductive layer 12, $C_{x0}$ will measure the larger change (increase) in capacitance. This is when a surface (self) capacitance measurement is used.

However, if a projected capacitance technique is used then the deflection such as shown in FIG. 2(*a*) above each $T_x/C_x$ pair of pads will result in a decrease in capacitive coupling between the $T_x/C_x$ pair ($T_x$ designates the grounded conductive layer which opposes a sense pad $C_x$).

It is imperative to protect the sense plate from changes in capacitance of the environment that affect the sense plate's measured capacitance to ground (surface capacitance measurements). This can be achieved through distance, such as when the sensor is mounted on a side of an apparatus (e.g. dishwasher) where the inside is far from any moving parts or objects that can affect the capacitance measured by the sense plate.

Figure 5:
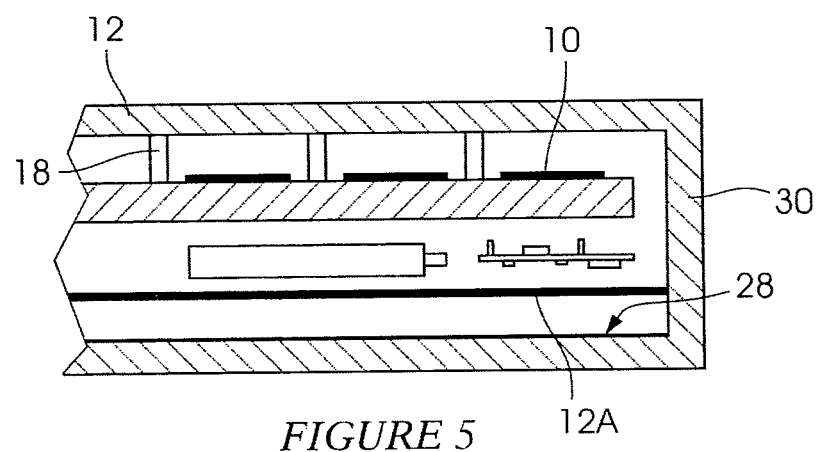
FIG. 5 depicts a sensor in a handheld device.

Another way is to ensure that the sense plate is shielded from external changes in capacitance by covering all sides with a grounded conductive layer 12A—see FIG. 5 as an example.

Another method is to cover some surfaces surrounding the sense plate with active driven shield structures. The purpose of this is well known in the art and can briefly be stated as "to keep the voltage potential between the sense plate and the structures connected to the driven shield, constant".

In FIG. 5 it is clear that a part of the grounded layer 12A which opposes the underside of the sense plates is displaced from an opposing inner surface 28 of a casing or housing 30. As such, a deflection under pressure at the bottom will have no effect on the capacitive measurement on the sense plate.

As disclosed in several other patents by Bruwer (U.S. Pat. No. 7,291,940; U.S. Pat. No. 7,265,494; U.S. Pat. No. 7,443,101) the capacitive sensing circuit can measure and detect proximity of objects (e.g. a user finger) and/or physical contact of objects. The detection of these proximity and/or contact events is not primarily related to pressure or force.

However, with the teachings of this application it is possible to implement a user interface that operates based on proximity events and physical contact events detected, and also operations that require a certain minimum level of force (i.e. it requires enough force). The one contact event is based on capacitive coupling between the sense plate and the detected object, whereas in the other contact detection the change measured is between the sense plate and a grounded layer, such change being caused by the deflection of the grounded layer under pressure from the user or object that produces the switch activation. This is deemed a capacitive pressure only (Cappo) type switch implementation.

Figure 3:
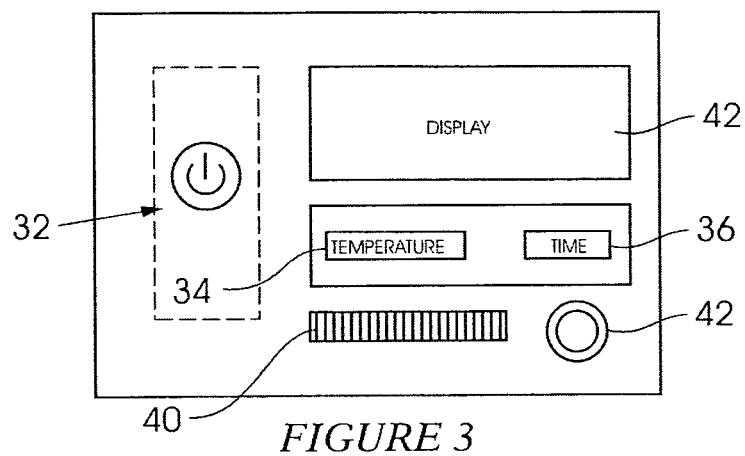
FIG. 3 shows a typical user interface.

An example of this is shown in FIG. 3 where three capacitive pressure only (Cappo) switches are implemented. This first is an on/off switch 32, the second a temperature adjustment selection switch 34, and the third a time setting selection switch 36. The switch 32 has a metal cover plate which is grounded for switch detection, but not grounded for proximity measurements. This is not proposed as a good choice, or even a good combination, but merely as an example of what can be achieved using a single capacitive measurement device.

Figure 6:
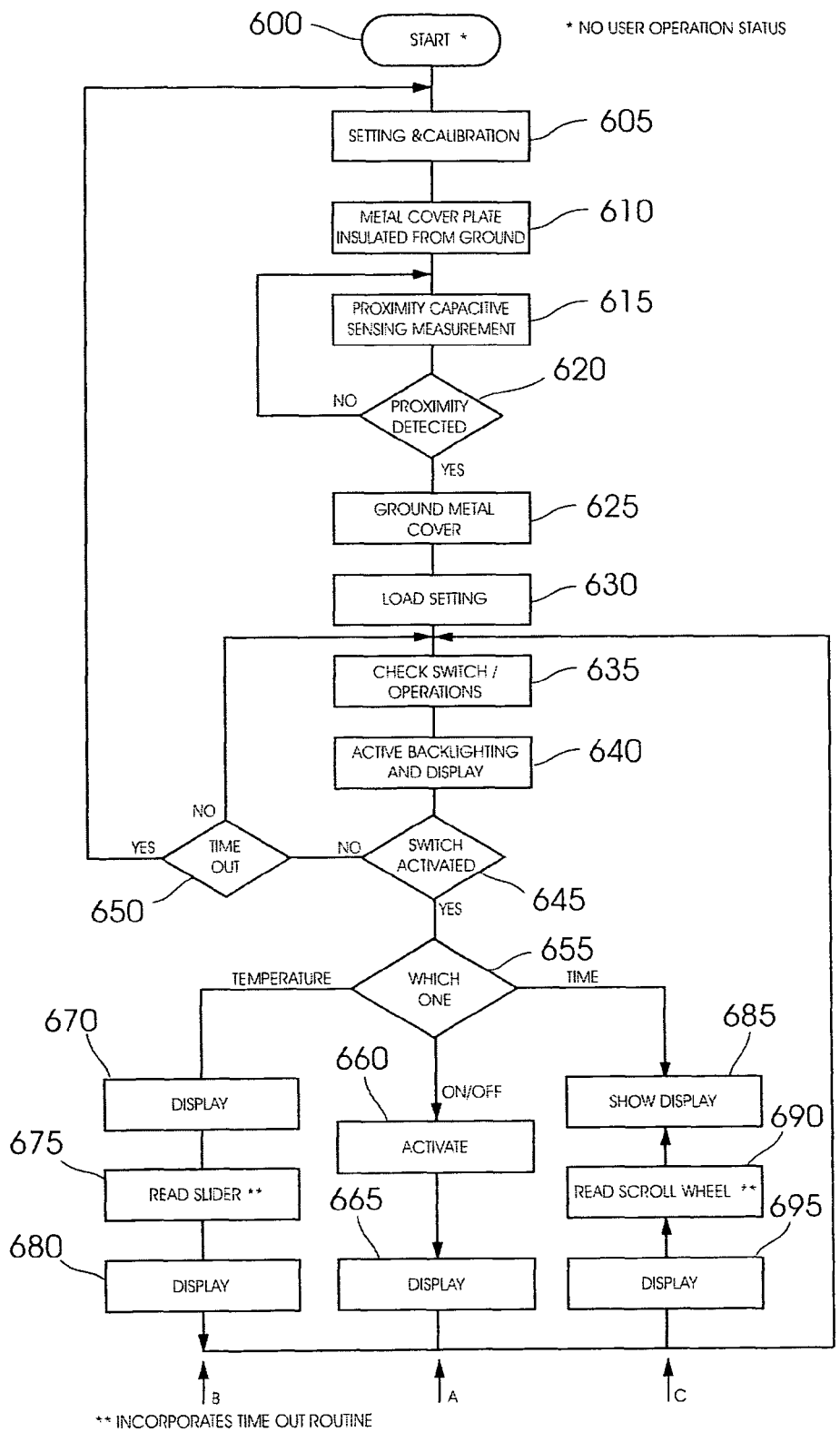
FIG. 6 is a high level flowchart depicting possible operational steps in the user interface of FIG. 3.

The operation of the user interface shown in FIG. 3 can, for example, be in accordance with the high level flowchart shown in FIG. 6. Although this flowchart is self-explanatory the following observations are made.

At step 600 it is assumed that the product in question, for example a heating plate of an electric hob, starts with power on, and that the product has not been operated by a user for a while. No user action is present before step 615 is reached.

When a proximity event, such as a user approaching the user interface, is detected (step 620) the implementation of the present inventive principles requires the grounding of the electrically conductive cover sheet/layer/plate (e.g. 12 in FIG. 2). The user interface moves from a potentially low power state (615/620) to an activated state (635/640) in which displays are activated and the user interface is scanned for a pressure-only activation (step 645).

In the given example it can happen that a pot boiling over may trigger the proximity event but then any real adjustments will require a physical contact exceeding a predetermined minimum force (determined by design of the overlay structures) ensuring that a potentially dangerous switch selection cannot happen accidentally.

The various branches in the flowchart show how the same capacitive measurement circuit can make use of other capacitive sensing techniques. For example the steps in branch A relate to the same pressure-only type single button switch. The steps in branch B introduce a capacitive sensing slider mechanism 40 (see FIG. 3) once the pressure only (Cappo) switch has been activated. This slider allows the user to easily adjust the temperature up or down and operates like normal touch sensor sliders (no pressure required) and may operate in conjunction with the display 34. Branch C is similar but relates to the operation of the scroll wheel 42 to adjust time either on a position basis (absolute position corresponding to a watch dial) or by movement.

Once the selected branch operation is complete, the steps 635 and 640 are repeated until a time out period (650) is reached upon which a low power mode of the switch is entered. Practical time out and other checks must be part of the implementation although these are not shown in the flowchart which depicts high level steps only.

Another method of using the traditional (non-pressure) capacitive sensor in combination with the Cappo switch structure is where the method involves a first step of selecting a branch using the traditional (non-pressure) capacitive sensor type operation and selecting for example a value for temperature or time, followed by activation through the pressure-only (Cappo) switch structure. This is an example to combine ease of operation with safety and protection against accidental activation through noise or other unintended incidents.

Another example is to implement the Cappo switch structure in combination with the inventions described in patents (U.S. Pat. No. 7,291,940; U.S. Pat. No. 7,265,494; U.S. Pat. No. 7,443,101) the disclosures in which are hereby incorporated into this specification. The advantage of the current invention is that the safety offered by a pressure-only switch is combined with the features of a capacitive measurement circuit that influences the user interface to halt operation when the product is released or not held. Specifically the moment the Cappo switch is used to activate the product, it is known that the device is held and a "touch" reference level can immediately be established.

When the product (for example a hair dryer or an iron) is released, the product can immediately be switched off for convenience or safety purposes.

Clearly the same capacitance measuring circuit may be employed to implement a pressure-only switch, a proximity sensing switch and/or a physical contact with a capacitive coupling required type switch.

Figure 7A:
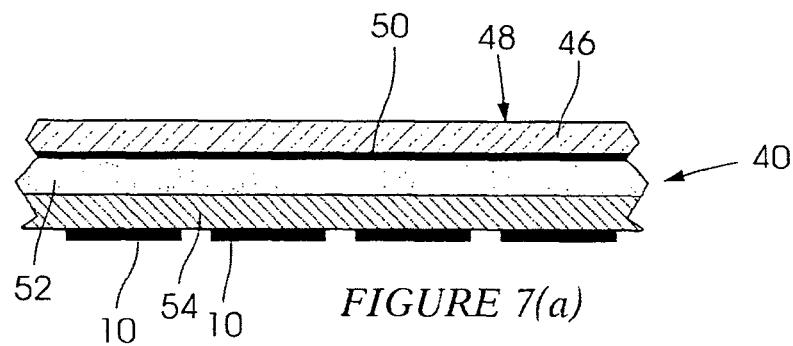
FIGS. 7(a) and 7(b) depict respective forms of a capacitive measurement type user interface.

Another aspect of this invention (see FIG. 7(a)) relates to the construction and design of a multi-layered membrane, overlay or cover plate 46 that can be used in the implementation of a capacitive measurement type user interface.

FIG. 7(a) shows an example with a somewhat flexible top layer or outer surface 48. This is the surface that is seen by the user and touched by the user (or operating object). It must therefore be of a suitable durable construction and material. Provision must be made for logos, icons and/or other key/button identification that can be recognised by the user on, in or under, this layer. The rigidity or flexibility of the layer 48 may, to a large extent, determine the force required to achieve the required or desired deflection.

Figure 2A:
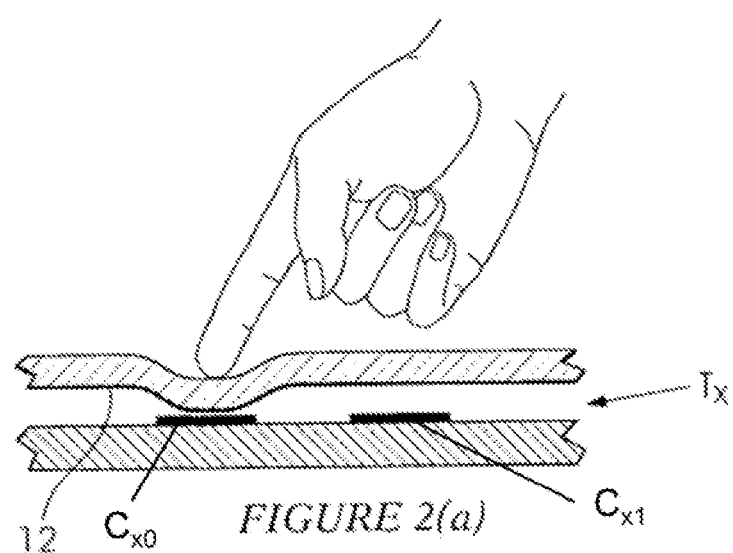
FIG. 2(a) shows the switch of FIG. 2 when activated.

This top layer, partly or in whole, or a layer of material attached to it, must be electrically conductive e.g. have a conductive layer 50 which must be connected to the system ground during some or all measurements. The conductive layer 50 faces a compressible layer 52 with spacers (not shown), or a construction to effect equivalent spacing operation, in that a touch or pressure exerted at one spot substantially prevents the compressible layer from causing an equal degree of compression in all areas. The goal is rather to compress locally around the point of pressure as is illustrated in FIG. 2(a).

A substantially rigid layer 54 offers rigidity to the interface membrane. A number of sense pads 10, with or without connections to electronic circuitry, are provided as part of the rigid layer 54.

The embodiment shown in FIG. 7(a) can for example be mounted across an open area with structural support only at the sides. The sense plates can be connected via flex pads (not shown) to electronics for capacitive measurements.

Figure 7B:
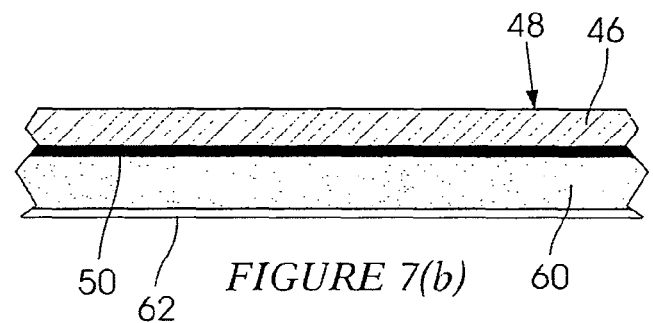

A similar membrane 60 is shown in FIG. 7(b). This membrane is more flexible and has a sticky bottom or lower layer 62. It can, for example, be directly attached to a printed circuit board with the sense plate or plates being part of the printed circuit board.

An advantage of the membrane construction described is that the membrane can be mass produced under tightly controlled conditions to achieve suitable tolerance levels. The membrane can be flat, curved or shaped to match a specific product for which it was designed. The membrane can be constructed for convenient usage in products with the membrane consisting of multiple layers with each layer specifically provided for the implementation of the capacitive measurement user interface.

The Cappo switches can be constructed in a matrix formation. This will be of significant benefit when a higher number of keys is required.

Figure 8A:
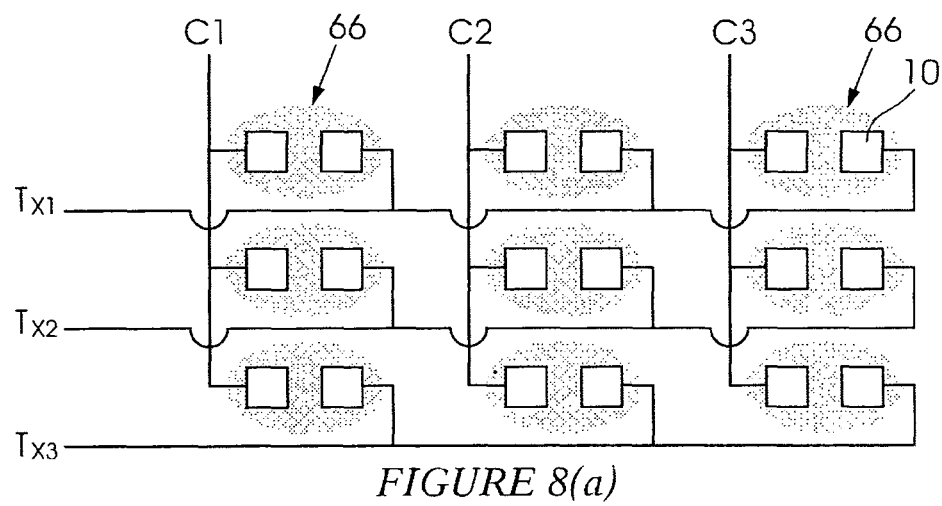
FIGS. 8(a) and 8(b) conceptually depict the construction of matrix keypads for projected and surface capacitive measurement circuits.
Figure 8B:
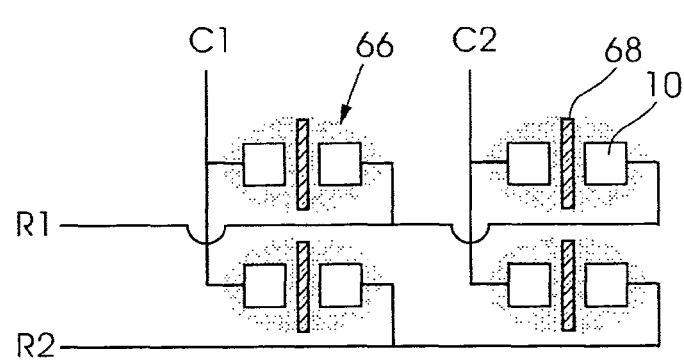

In FIG. 8(a) and FIG. 8(b) examples are shown (conceptually) for the construction of matrix designed key pads.

FIG. 8(a) is for a 3×3 (9 keys 66) projected capacitance implementation. Grey areas 66 show where the deflection must be for good operation.

FIG. 8(b) is a similar construction for a surface capacitance measuring system. Grounded tracks 68 between the sense pads prevent capacitive coupling from one pad to another. The grounded tracks could be replaced by active driven shield structures (not shown).

In FIG. 8(a), consider an embodiment wherein each of the grey areas (66) includes an electrically conductive member, for example carbon coating attached to a flexible material (e.g. a rubber pad). The areas 66 are electrically insulated from each other and in some embodiments also from the antenna structure. This may be very similar to what is used in some standard key pads today for conventional keyboards except that no electrical conductive path is required. It is clear that each individual projected capacitance measurement antenna pair (Crx—receiver, Ctx—driver) is covered or overlayed with a conductive layer that is not connected to the conductive layers over the other antenna pairs. Consider an embodiment with the conductive layers not being grounded i.e. floating. In such a construction an object providing a capacitive coupling between the conductive layer above an antenna pair and earth, will cause less charge to be transferred between that antenna pair (driver and receiver pair). As such the proximate object will cause the counts in a projected charge transfer measurement implementation to rise because more cycles are required to transfer a specific reference amount of charge. The antenna pair with the best capacitive coupling between the conductive layer above it and earth/ground will show the highest rise in count viz as the object approaches the specific antenna pair the counts for that antenna structure will rise the most. The construction may be likened to that of a conventional key pad matrix in that the matrix of horizontal and vertical lines may be similar, but the construction will yield much more information with regards to user actions, activations or switch operating conditions etc.

Physical contact between the material attached to the conductive cover layer and the approaching object (for example a rubber key pad and a user finger) will cause even better capacitive coupling from the conductive layer to earth/ground, due to a reduced air gap. This physical contact event, which will cause a noticeable change in the measurement count, can be identified from the measured data. The capacitive measurement circuit may form part of the user interface of a product (e.g. mobile phone, computer key board, note book, alarm interface, industrial key board etc) and the measurements may be used to indicate which key is being approached or if a specific key has been physically contacted. This information may be used to indicate such event information on a display or indication structure (being audio or visual or otherwise haptic). For example, a key touched, but not pressed, may provide a flashing or light color character on a display, but once pressed it will be permanently selected. If touched but not pressed, the character will disappear as soon as the key is not touched any more, or after a short delay.

The FIG. 8(a) embodiment discussed above may also be used to implement a tracking mechanism to effect movement of a cursor on a display or highlighting icons or option for possible selection. This is similar to, for example a trackball, an optical track pad, a mouse etc. A user sliding a finger over a key board according to this embodiment will cause the measurements of the capacitive measurement system to deviate in such a way that the movements can be tracked. The finger may move in X or Y directions or even diagonally. It is advisable to use software filtering, extrapolation, interpolation and other appropriate algorithms. Specifically the data from various antenna pairs may be used to increase positional accuracy and resolution of the tracking action. The data may be used to link the tracked movements to a cursor in a way similar to the manner in which the movement of a mouse is linked to the cursor on a screen. This can be seen as a low cost tracking implementation. It is even possible to do tap and double tap actions without needing to press the button on the key board. Speed of movement may also be used to determine distance of movement applied to the cursor, e.g. slow movement may result in accurate (fine) steps and fast movement may be used for greater steps. Depending on the sensitivity of the system a user may even operate this interface whilst wearing gloves.

As an additional identifiable event consider the case where the user presses a button to cause deviation that ultimately results in contact between the material attached to the conductive overlay and the antenna pair. When the material attached to the conductive layer or the conductive layer approaches and specifically when it is in close contact with, the antenna pair, the transfer of charge between the driver and receiver will be greatly enhanced and as such a drop in the charge transfer counts will be effected. The contact with the antenna pair or antenna structure does not need to be electrically conductive. This can be the removal of an air gap due to the deflection under pressure or just the compression of a material that, when compressed, forms a better dielectric or coupling between the antenna structure and the conductive cover member.

There are two distinct cases for the embodiment discussed above. In the first instance the conductive cover member is brought closer to the antenna pair. Thus more charge is leaked away and hence the charge transferred from the driver antenna to the receiver antenna is reduced. In the next case one can view an extreme situation in which the driver antenna is brought into electrical contact with the receiver antenna (i.e. a short) and hence a very large amount of charge is transferred during each cycle. There is a scale of options from the one side to the other but, with enough sensitivity in the measurement system, very clear boundaries can be defined with regard to identifying the event taking place at a time. This then allows for the structure according to this invention to enable the user interface to identify the several mentioned events with respect to a specific key (antenna pair) e.g. an object coming into proximity, a light physical contact event with little pressure, a hard contact event with pressure such that a deviation is caused in the material attached to the conductive layer, a tap and a double tap action plus using sequential information from the measurement system to construct a tracking device. When contact is made between the material attached to the conductive layer and the antenna pair, there is no specific need for electrical contact to be established for this to work. A mechanism may be employed to make a "click" sound ideally simultaneously with the contact being established with the antenna structure, in order to create a tactile switch feeling. The "click" or tactile mechanism may be plastic or metal i.e. of electrically conductive or non-conductive materials and may in fact form part of how the contact is established.

If the conductive members covering the antenna pairs are grounded then the proximity events will not be seen. Also, a touch will at least have to disturb the distance between an antenna pair and the conductive member associate therewith. In this case the change in distance between the conductive layer and the antenna pair will manifest itself in a change in the capacitive measurement transfer count value (for charge transfer capacitive measurement implementations). When contact is made between the material attached to the conductive layer/member and the antenna pairs, the counts will be very high or may in fact result in too little charge being transferred from the driver to the receiver to yield a value. (a typical time-out situation). This may be a predefined situation that can be accurately interpreted.

With the conductive cover member grounded to earth or to the system ground the change in distance will be reflected in the charge transferred in the capacitive measurement system. As such, a clear picture can be formed of the change in distance which is, in turn, related to the pressure applied. It is therefore possible to define an arbitrary level or levels to differentiate between light or hard touches. A light touch may be seen as a tentative or temporary selection, but a hard touch may finalise the selection. A light touch may for example show a character flashing or in a light colour on a display and if a hard touch does not follow, the showing of the character may, for example be removed after a short period of time. Ideally the capacitive measurement circuit and the operations such as filtering and decision making are integrated into a microchip which will then enable a cost-effective integration of a user interface, in accordance with this invention, with a product.

The tracking functions may also be applied to multiple fingers or objects affecting the measurements of multiple antennas structures and to use this information to implement dual touch or multi touch gestures such as for example pinching or rotating.

Although the embodiment was described mostly in terms of a charge transfer projected/mutual or surface capacitive measurement systems, other methods of capacitive measurements may also be used.

Figure 9:
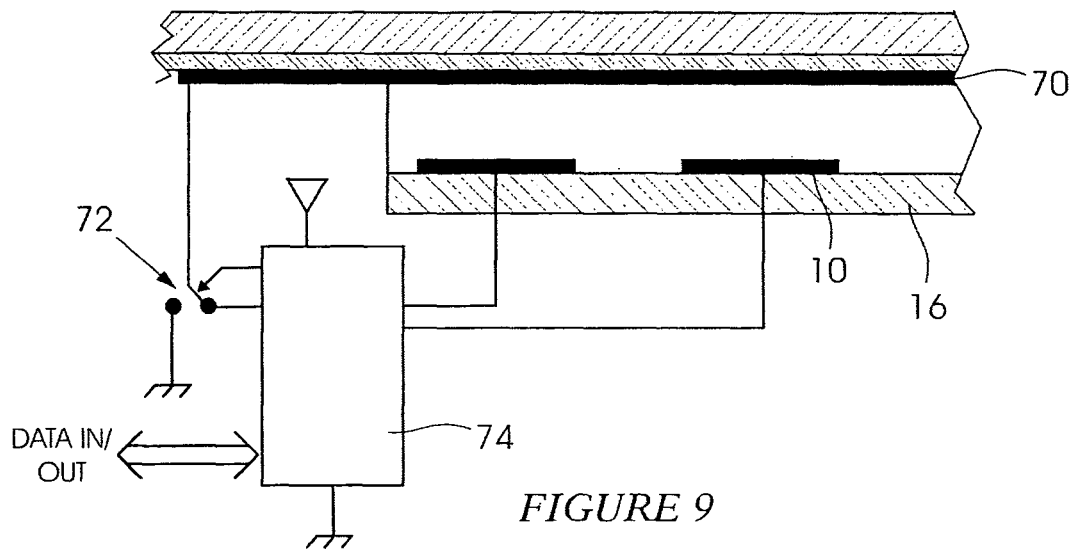
FIG. 9 shows the operation of a modified form of the switch of FIG. 2(a)

In FIG. 9 an implementation is shown wherein an electrically conductive surface or layer 70 that is usually grounded, in accordance with the techniques described hereinbefore can, at times, through the use of an electronic switch 72, be disconnected from ground and connected to a microchip-implemented capacitive measurement circuit 74. When not connected to ground the layer 70 can act as a sense plate which can be used for early detection of user activity through, for example, proximity detection or physical contact (no pressure) events. The switch 72 shown outside the microchip for switching between ground and Cx3 may preferably be implemented inside the microchip. In some cases the layer that is not grounded may act as a series capacitor between the sense plate and the object that is to be sensed. The principle is however the same viz the capacitance that changes due to the object approaching or touching the product using this technology is reflected and measured on the sense plate.

In a variation of this embodiment the measurement circuit 74 may sense a proximity event and only then ground the conductive layer to check for a Cappo switch operation. This allows for lower power modes but highly reliable switch operation through capacitive pressure only (Cappo) switch implementation using a single measurement circuit and a single sense plate construction. This is very advantageous for form factor, safety, reliability and cost considerations.

Figure 10A:
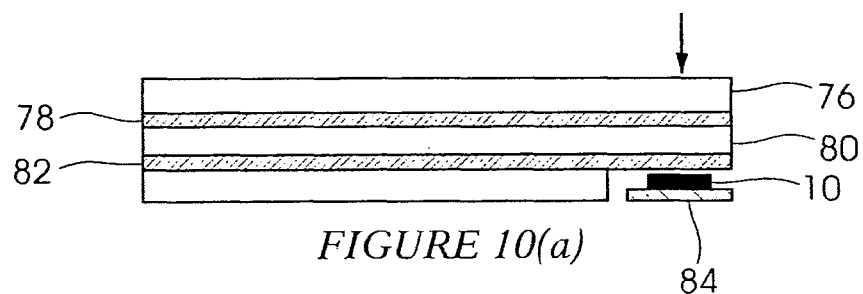
FIGS. 10(a) and 10(b) show a two-dimensional sense pad being grounded to create a CAPPO (capacitive pressure only) switch for safe/controlled activation, and a telephone with a CAPPO structure respectively.
Figure 10B:
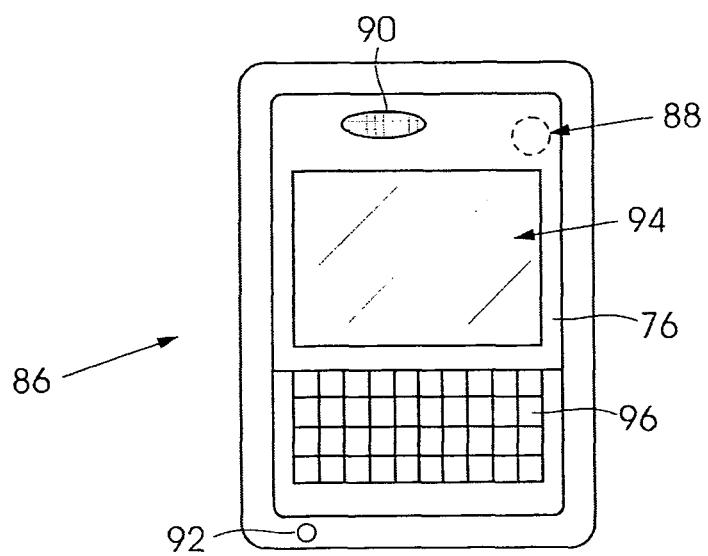

FIGS. 10(a) and 10(b) depict the structure of an embodiment for using the Cappo principle to eliminate the use of a normal push button type switch in a product with a glass (or other transparent) overlay. This is typical of, for example, a mobile phone or handheld device with an LCD screen (for example remote controls, PDA's, PND's, e-readers etc.).

FIG. 10(a) shows a pressure-sensitive glass/PET layer 76 overlying a conductive layer 78 on glass 80. A grounded layer 82, for LCD noise shielding, opposes a sensor 10 on a PCB 84 which includes a Cappo switch.

FIG. 10(*b*) shows a device 86 such as a telephone with Cappo structure 88 of the kind shown in FIG. 10(*a*). The device includes a loudspeaker 90, microphone 92, an LCD 94 and a keyboard 96.

The Cappo principles taught in this application can be used for example to implement a Cappo switch under a corner of a glass surface. This switch only functions with pressure and thus removes the need for another type of push button or electromechanical switch for secure activation/de-activation, unlocking of the keyboard etc.

It is also possible to implement backlighting that is activated when a proximity or touch event is detected to enable easy location of this button.

FIG. 11 shows inoperative and operative configurations of a possible construction of a 2D Cappo switch implementation 98. A sensor layer 100 is sandwiched between two compressible layers 102 which are flanked by grounded layers 104 resulting in a well-shielded sense plate. An air gap or transparent layer 106 overlies an LCD 108. In this construction, when the outer layer is grounded, the 2D upper surface 110 is pressure-sensitive and a stylus or a hand in a glove will work satisfactorily (similar to resistive implementations).

FIGS. 12(*a*) and 12(*b*) show respective examples of how a hanging scale may be implemented using metal bars 118 and 120. This is similar to using strain gauges to measure the deflection of metal under pressure. The bar 120 is electrically grounded. In a mutual capacitance measurement mode, the capacitance projected from a Ctx pad (122) to a receiver pad Crx (124) is measured (FIG. 12(*a*)). The pads are mounted to the bars through insulation 130. When the metal bars are moved apart or together the capacitance changes. This is a direct indication of the force on the metal bars. This gives a direct identification of the force on the metal bars. This is similar to an arrangement used in a scale implemented using strain gauges, but with no strain gauge required.

In FIG. 12(*b*) a receiver pad 132 effects a surface movement measurement.

In some embodiments the outer layer (where the user will touch) can be connected to an active driven shield mechanism instead of being grounded.

In an embodiment to improve the proximity sensing distance during the period when the conductive overlay is not grounded, a capacitor is connected between the sense plate and the conductive overlay. This will form a capacitor in series between the sense plate and the object (e.g. user finger) to be sensed when the overlay is not grounded. This capacitor may typically be in the nano farad range and, as such, is a big value compared with the typical capacitance sensed with Azoteq's proximity sensors. If this capacitor is not connected, the series capacitor is in fact the capacitor formed between the sense plate and the conductive overlay. This may be a very small capacitor and will then (if too small) impede the sensing from the sense plate to the object approaching the overlay.

The invention has been described with reference to the detection of proximity or touch events using capacitance measurements. However the techniques embodied herein can be used for the measurement of other parameters such as charge (coulomb), current (amps), frequency (Hertz), resistance (ohm), pressure (Newton), and so on, that can be derived from a translation to capacitance as described above for the scale. For example the charge transfer method and a resistor can be used to measure voltage when a voltage source is connected through the resistor to the charge transfer measurement circuit.

A microchip and specifically a microprocessor with additional circuitry can be used to implement a large part of the functionality required according to this invention. For example the capacitive measurement circuit, the filtering, the decisions such as recognition of specific events, interpretation of the data for event differentiation or movement tracking etc can all be implemented in a single microelectronic device that is connected to the antenna structures in accordance with the disclosures.

The invention claimed is:

1. A user interface for a product, wherein the user interface comprises a construction including a projected, charge transfer based capacitance measurement circuit connected to at least first and second sense plates of a sense plate structure for measuring the projected capacitance between said first and second sense plates, said sense plate structure being covered by an electrically conductive and electrically floating cover member, that at least forms an area above said sense plate structure, and the construction is such that force applied to the conductive cover member or a layer of material, that is attached to the conductive cover member, causes a deflection that changes a distance between the sense plate structure and the conductive cover member under the point of the applied force, wherein the projected capacitance measurement circuit provides measurement data to identify and differentiate between the following events:
   a. an object coming into proximity of the conductive cover member, without making physical contact therewith or said object coming into contact with the conductive cover member or material attached to the conductive cover member, and causing a decrease in the magnitude of the projected capacitance of the sense plate structure between the first and second sense plates measured by the projected capacitance measurement circuit; and
   b. an object coming into contact with and applying more than a minimum force to the conductive cover member or material attached to the conductive cover member so that the conductive cover member or the material attached to the conductive cover member deflects and comes within a predetermined distance or makes contact with the sense plate structure in a way that causes an increase in the magnitude of the projected capacitance of the sense plate structure between the first and second sense plates measured by the projected capacitance measurement circuit.

2. The user interface of claim 1 wherein the conductive cover member comprises a snap dome structure that deflects with a sudden movement when more than a minimum force is applied to it and then results in tactile feedback to the user.

3. The user interface of claim 2 wherein the conductive cover member above said sense plate structure is grounded once a proximity event has been detected via said sense plate structure and wherein events where an engaging object applies sufficient force to said conductive cover member to cause its deflection, are detected thereafter, via an associated change in measured capacitance.

4. The user interface of claim 3, wherein use is made of parasitic capacitance cancellation techniques to compensate for an increase or decrease in measured capacitance due to said grounding of said conductive cover member.

5. The user interface of claim 4, wherein the connection between ground and said conductive cover member is removed after a predetermined period during which no deflection of said conductive cover member that results in sufficient measured capacitance change to qualify as an event, has been detected.

6. The user interface in accordance with claim 2 wherein events as per section a) of claim 1 result in a reduced charge transferred between an associated driver one of said sense plates and a receiver one of sense plates, and events as per section b) of claim 1 result in an increased charge being transferred from the driver sense plate to the receiver sense plate.

7. The user interface in accordance with claim 2 wherein the conductive cover member is electrically insulated from the sense plate structure.

8. The user interface according to claim 1 which comprises a matrix of sense plate structures and use of projected capacitance measurements, and wherein a sequence of capacitive measurement data resulting from a plurality of events as described in section (a) of claim 1 and detected by the capacitance measurement circuit through the matrix of sense plate structures, is used to implement a capacitive track pad system and the tracking function to control movement of a cursor on a display or to move between or highlight icons on a display.

9. The user interface according to claim 8 wherein the sequence of measurement data is further used to implement and recognize a tap and/or double tap selection command of soft keys or icons on the display, in response to an event(s) as described in section a) of claim 1, and wherein speed of movement of an engaging object is used to determine a distance of movement applied to said cursor in a manner such that slow movement results in small movement steps, and fast movement results in larger movement steps.

10. The user interface according to claim 8 wherein use is made of conductive snap dome structures over specific projected capacitance sense plate structures to detect events as described in section b) of claim 1 related to specific sense plate structures and wherein events as described in section b) of claim 1 are interpreted as selections of keys or icons associated with the said cursor and the snap dome structures result in tactile feedback to the user.

11. The user interface according to claim 2 wherein the capacitance measurement circuit provides information related to a distance between the conductive cover member and the sense plate structure, and wherein a threshold in measured capacitance is implemented to distinguish between a light touch and a hard touch, and wherein this information is relayed to a user through a display, and wherein the hard touch is interpreted as a selection, and the light touch is interpreted as a temporary or preliminary selection.

12. The user interface according to claim 5 wherein the capacitance measurement circuit provides information related to a distance between the conductive cover member and the sense plate structure, and wherein a threshold in measured capacitance is implemented to distinguish between a light touch and a hard touch, and wherein this information is relayed to a user through a display, and wherein the hard touch is interpreted as a selection, and the light touch is interpreted as a temporary or preliminary selection.

13. A method of implementing a touch sensing user interface comprising a projected, charge transfer based capacitance measurement circuit and at least one floating electrically conductive cover member, said cover member forming an area over at least first and second sense plates of a sense plate structure connected to said projected capacitance measurement circuit, and a surface to be touched by a user, and wherein the method further requires that force applied to a point on the touch surface results in a deflection that decreases the distance between the sense plate structure and the conductive cover member under the point of the applied force, and wherein the method includes the step of having the measurement data from the projected capacitance measurement circuit interpreted to identify and differentiate between the following events:
   a. an object coming into proximity of the conductive cover member without making physical contact with the conductive cover member or material attached to the conductive cover member or said object coming into physical contact with the conductive cover member or material attached to the conductive cover member; and wherein said object causes a decrease in the magnitude of the projected capacitance of the sense plate structure between the first and second sense plates measured by the projected capacitance measurement circuit; and
   b. an object coming into physical contact with the conductive cover member or material attached to the conductive cover member and such object exerting more than a minimum force to result in the conductive cover member or the material attached thereto deflecting and the conductive member coming within a predetermined distance of or in contact with the sense plate structure to cause an increase in the magnitude of the projected capacitance of the sense plate structure between the first and second sense plates measured by the projected capacitance measurement circuit.

14. The method of claim 13 wherein said floating conductive cover member is grounded once a proximity event has been detected via said sense plate structure and wherein events where an engaging object applies sufficient force to said conductive cover member to cause its deflection, are detected thereafter, via an associated change in measured capacitance, and where parasitic capacitance cancellation techniques are used to compensate for an increase or decrease in measured capacitance due to said grounding of said conductive cover member.

15. The method of claim 14 wherein the connection between ground and said conductive cover member is removed after a predetermined period during which no deflection of said conductive cover member that results in sufficient measured capacitance change to qualify as an event, has been detected.

16. The method of claim 13 wherein said first and second sense plates comprise a first, driver sense plate and a second, receiver sense plate and physical contact by an object exerting more than a minimum force causes contact between the conductive cover member or material attached thereto and the driver and receiver sense plates of the sense plate structure in a way that results in an increased measured capacitance between the driver and the receiver sense plates, even if the contact is through an electrically insulating layer, whereas a contact exerting less than said minimum force, results in a decreased measured capacitance between the driver and receiver sense plates of the sense plate structure.

17. The method in accordance with claim 13 which includes the step of using a sequence of measurement data from a matrix of projected capacitance sense plate structures and corresponding conductive cover members resulting from events as described in section a) of claim 13 to create a capacitive track pad system and the tracking mechanism functions to move a cursor on a screen or to assist in selection of icons or touch keys on a screen.

18. The method in accordance with claim 17 which includes the step of using data from the capacitance measurement circuit to identify a tap and/or double tap command based on an event as described in section a) of claim 13, and wherein speed of movement of an engaging object is used to determine a distance of movement applied to said cursor in a manner such that slow movement results in small movement steps, and fast movement results in larger movement steps.

19. The method in accordance with claim 17 which includes the use of conductive snap dome structures over specific projected capacitance sense plate structures and the step of using data from the capacitance measurement circuit to detect events as described in section b) of claim 13 on specific projected capacitance sense plate structures, and wherein said detections are interpreted as selections of keys or icons associated with said cursor, and the snap dome structures result in tactile feedback to the user.

20. The method in accordance with claim 17 which includes the step of using measurement information, resulting from multiple objects in proximity to or in contact with conductive cover members or material attached to the conductive cover members, to implement dual touch or multiple touch gesture commands.

\* \* \* \* \*